(12) United States Patent
Baker et al.

(10) Patent No.: US 6,909,354 B2
(45) Date of Patent: Jun. 21, 2005

(54) ELECTRONIC PRESSURE SENSITIVE TRANSDUCER APPARATUS AND METHOD FOR MANUFACTURING SAME

(75) Inventors: Jeffrey R. Baker, Thousand Oaks, CA (US); Carlos S. Sanchez, Oxnard, CA (US)

(73) Assignee: Interlink Electronics, Inc., Camarillo, CA (US)

( * ) Notice: Subject to any disclaimer, the term of this patent is extended or adjusted under 35 U.S.C. 154(b) by 40 days.

(21) Appl. No.: 10/067,952

(22) Filed: Feb. 5, 2002

(65) Prior Publication Data

US 2002/0104369 A1 Aug. 8, 2002

Related U.S. Application Data

(60) Provisional application No. 60/267,455, filed on Feb. 8, 2001.

(51) Int. Cl.$^7$ ................................................. H01C 10/10
(52) U.S. Cl. ........................... 338/47; 338/99; 338/114; 338/128
(58) Field of Search ............................... 338/47, 5, 128, 338/92, 95, 114, 99

(56) References Cited

U.S. PATENT DOCUMENTS

| 4,079,194 A | 3/1978 | Kley |
| 4,129,747 A | 12/1978 | Pepper, Jr. |
| 4,296,406 A | 10/1981 | Pearson |
| 4,314,227 A | 2/1982 | Eventoff |
| 4,314,228 A | 2/1982 | Eventoff |
| 4,475,008 A | 10/1984 | Doi et al. |
| 4,489,302 A | 12/1984 | Eventoff |
| 4,598,181 A | 7/1986 | Selby |
| 4,620,062 A | 10/1986 | Mizzi et al. |
| 4,623,757 A | 11/1986 | Marino |
| 4,687,885 A | 8/1987 | Talmage, Jr. |

(Continued)

FOREIGN PATENT DOCUMENTS

JP         52-56957        *  5/1977    ................. 349/153

*Primary Examiner*—Karl D. Easthom
(74) *Attorney, Agent, or Firm*—Brooks Kushman P.C.

(57) ABSTRACT

The cost and complexity of an electronic pressure sensitive transducer are decreased by constructing such a transducer directly on a printed circuit board containing support electronics. Conductive traces are formed on the printed circuit board to define a contact area. A flexible substrate having an inner surface is positioned over the contact area. An adhesive spacer, substantially surrounding the contact area, attaches the flexible substrate to the printed circuit board. At least one resistive layer is deposited on the flexible substrate inner surface. In use, the resistive layer contacts at least two conductive traces in response to pressure applied to the flexible substrate to produce an electrical signal indicative of applied pressure.

29 Claims, 5 Drawing Sheets

U.S. PATENT DOCUMENTS

| | | | |
|---|---|---|---|
| 4,739,299 A | 4/1988 | Eventoff et al. | |
| 4,752,655 A | 6/1988 | Tajiri et al. | |
| 4,798,919 A | 1/1989 | Miessler et al. | |
| 4,810,992 A | 3/1989 | Eventoff | |
| 4,996,511 A | 2/1991 | Ohkawa et al. | |
| 5,008,497 A | 4/1991 | Asher | |
| 5,159,159 A | 10/1992 | Asher | |
| 5,296,837 A | 3/1994 | Yaniger | |
| 5,302,936 A * | 4/1994 | Yaniger | 338/47 |
| 5,357,065 A | 10/1994 | Mitamura | |
| 5,539,159 A | 7/1996 | Protheroe et al. | |
| 5,659,334 A | 8/1997 | Yaniger et al. | |
| 5,828,363 A | 10/1998 | Yaniger et al. | |
| 5,942,733 A | 8/1999 | Allen et al. | |
| 5,943,044 A | 8/1999 | Martinelli et al. | |
| 5,989,700 A | 11/1999 | Krivopal | |
| 6,087,925 A * | 7/2000 | DeVolpi | 338/92 |
| 6,102,802 A * | 8/2000 | Armstrong | 463/37 |
| 6,115,030 A | 9/2000 | Berstis et al. | |
| 6,121,869 A * | 9/2000 | Burgess | 338/99 |
| 6,137,475 A | 10/2000 | Ginn et al. | |
| 6,184,124 B1 * | 2/2001 | Hasegawa et al. | 438/625 |
| 6,208,271 B1 | 3/2001 | Armstrong | |
| 6,225,814 B1 | 5/2001 | Oreper et al. | |
| 6,313,731 B1 | 11/2001 | Vance | |
| 6,323,840 B1 | 11/2001 | Steinbrunner | |
| 6,331,849 B1 | 12/2001 | VandenBoom | |
| 6,351,205 B1 * | 2/2002 | Armstrong | 338/114 |
| 6,404,323 B1 * | 6/2002 | Schrum et al. | 338/92 |
| 6,531,951 B2 * | 3/2003 | Serban et al. | 338/47 |
| 6,590,177 B2 | 7/2003 | Takahashi et al. | |
| 6,756,555 B2 | 6/2004 | Lin | |
| 2002/0007677 A1 * | 1/2002 | Coates et al. | 73/514.16 |
| 2002/0024503 A1 * | 2/2002 | Armstrong | 345/167 |
| 2002/0055384 A1 * | 5/2002 | Armstrong | 463/37 |
| 2002/0192939 A1 * | 12/2002 | Sugihara | 438/629 |
| 2004/0130528 A1 | 7/2004 | Baker et al. | |

* cited by examiner

ELECTRONIC PRESSURE SENSITIVE TRANSDUCER APPARATUS AND METHOD FOR MANUFACTURING SAME

CROSS-REFERENCE TO RELATED APPLICATIONS

This application claims the benefit of U.S. provisional application Ser. No. 60/267,455 filed Feb. 8, 2001 which is incorporated herein by reference.

BACKGROUND OF THE INVENTION

1. Field of the Invention

The Present invention relates to transducer systems for sensing pressure.

2. Background Art

Pressure sensitive transducers generate a signal indicative of the amount of pressure applied to a flexible membrane. Such transducers may also generate a signal based on the location of pressure applied to the flexible membrane. Such pressure sensitive transducers provide inputs for a wide variety of applications such as remote controls, game controllers, mouse pads, tactile sensors, and the like. Pressure sensitive transducers are typically coupled with electronics that condition and amplify pressure signals.

Various constructions for pressure sensitive transducers are possible. One type includes one or more force sensing resisters (FSRs). Various FSRs have been disclosed, such as those described in commonly assigned U.S. Pat. Nos. 4,314,227; 4,314,228; and 4,489,302; each of which is hereby incorporated by reference in its entirety. Typically, an FSR is composed of three parts, a rigid base, a spacer, and a resistive membrane. Conductive traces are typically arranged in separated interdigitated sets on the base. These traces may be configured in a single zone or in multiple zones to allow, for example, pointing devices as described in commonly assigned U.S. Pat. Nos. 5,659,334 and 5,828,363, each of which is hereby incorporated by reference in its entirety. The flexible resistive membrane is spaced apart from the base layer by a spacer, which is typically a ring of material around the outer edge of the conductive traces. The spacer is also typically coated with adhesive to hold the device together. The flexible top membrane may be made of a polymer coated on its inner face with semi-conductive or resistive ink, giving the FSR force sensing properties. This ink is described in commonly owned U.S. Pat. Nos. 5,296,837 and 5,302,936, each of which is hereby incorporated by reference in its entirety.

In most practical applications, the FSR must be connected to sensing and conditioning electronics in order to effectively operate. One way this may be accomplished is by connecting the FSR to a printed circuit board containing the electronics with a multi-conductor cable. Another way of connecting the FSR to support electronics is to adhere the FSR base directly to the circuit board containing the electronics. Electrical connection may be made between traces on the FSR and corresponding traces on the printed circuit board using z-tape, which only conducts in a direction perpendicular to the tape surface. While either method is effective, both have unnecessary manufacturing steps and require unnecessary components, thus increasing the cost of a pressure sensitive transducer system as well as increasing the likelihood of system failure. What is needed is a pressure sensitive transducer and a method for making such a transducer that requires fewer components and fewer manufacturing steps without sacrificing transducer performance.

SUMMARY OF THE INVENTION

The present invention decreases the cost and complexity of an electronic pressure sensitive transducer by constructing such a transducer directly on a printed circuit board containing support electronics.

An electronic pressure sensitive transducer producing an electrical signal indicative of applied pressure is provided. The transducer includes a printed circuit board accepting a plurality of electronic elements for processing the transducer electrical signal. Conductive traces are formed on the printed circuit board to define a contact area. A flexible substrate having an inner surface is positioned over the contact area. An adhesive spacer substantially surrounds the contact area. The adhesive spacer attaches the flexible substrate to the printed circuit board. At least one resistive layer is deposited on the flexible substrate inner surface. The resistive layer contacts at least two of the traces in response to pressure applied to the flexible substrate to produce the electrical signal indicative of applied pressure.

In an embodiment of the present invention, at least one resistive layer is made with resistive ink.

In another embodiment of the present invention, a pedestal is formed on the printed circuit board substantially around the contact area. The pedestal receives the adhesive spacer for attaching the flexible substrate. The pedestal increases the space between resistive layers on the substrate and conductive traces on the printed circuit board. The pedestal may be formed by coating traces on the printed circuit board with a non-conductive material such as soldermask.

In yet another embodiment of the present invention, the conductive traces include a plurality of sets of traces. Each set of traces is interconnected within a zone of the contact area. An interconnected set of contact traces extends into each zone. At least one of the interconnected set of traces may be connected to the electronic elements for processing the transducer signal via a through-hole in the printed circuit board. The through-hole may be within the contact area.

In still another embodiment of the present invention, conductive traces are arranged in sets of interconnected traces. At least two sets of traces are interdigitated.

In a further embodiment of the present invention, conductive traces comprise copper traces covered with an oxidation preventing conductive material.

In a still further embodiment of the present invention, conductive traces comprise screen printed carbon ink.

A method of forming an electronic pressure sensitive transducer on a printed circuit board is also provided. The printed circuit board accepts electronic components for producing signals generated by the pressure sensitive transducer. A plurality of conductive traces are formed on the printed circuit board to form a contact area. At least one resistive layer is deposited on an inner side of a flexible substrate. The flexible substrate is assembled on the printed circuit board such that the flexible substrate resistive layer is facing the printed circuit board conductive traces. The flexible substrate is held to the printed circuit board by an adhesive substantially surrounding at least a portion of the contact area.

A transducer system is also provided. The system includes a printed circuit board having a plurality of conductive traces. At least two of these traces define contact areas. The printed circuit board is constructed to accept electronic elements for processing electrical signals produced by a plurality of transducers. Each of these signals is indicative of pressure applied to at least one of the transducers. The system also includes at least one flexible substrate having an inner surface facing each contact area. At least one adhesive spacer substantially surrounds each contact layer to attach at least one flexible substrate to the printed circuit board. At least one resistive layer is deposited on a flexible substrate inner surface. Each resistive layer contacts at least two of the traces in response to pressure applied to the flexible substrate to produce an electrical signal indicative of applied pressure. The contact areas, at least one flexible substrate, at least one adhesive spacer and at least one resistive layer form the plurality of transducers, each transducer constructed on the printed circuit board.

A method of forming an electronic pressure sensitive transducer on a printed circuit board supporting electronic elements is also provided. A portion of conductive material on a printed circuit board is selectively removed to define traces in a contact area, traces connecting the electronic elements to the contact area, and at least a portion of a pedestal.

The above objects and other objects, features, and advantages of the present invention are readily apparent from the following detailed description of the best mode for carrying out the invention when taken in connection with the accompanying drawings.

DETAILED DESCRIPTION OF THE PREFERRED EMBODIMENT(S)

Figure 1:
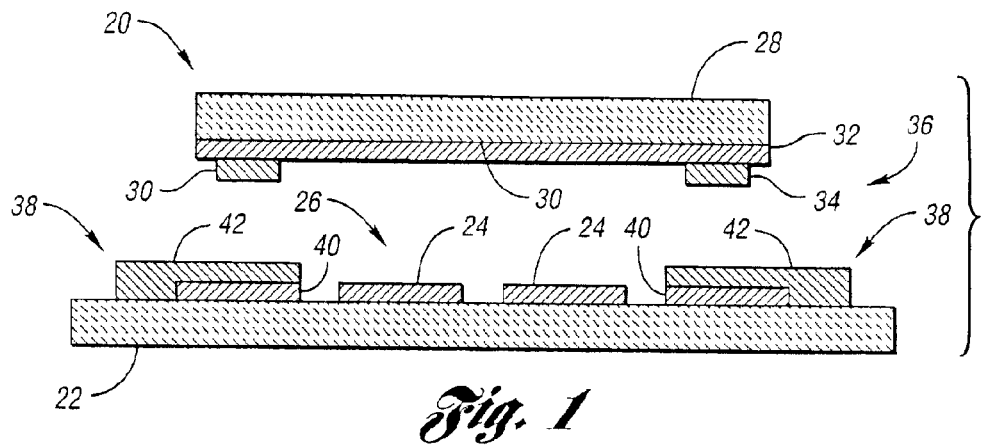
FIG. 1 is an exploded cross-sectional view illustrating a conceptualized pressure sensitive transducer according to an embodiment of the present invention.

Referring to FIG. 1, an exploded cross-sectional view illustrating a conceptualized pressure sensitive transducer according to an embodiment of the present invention is shown. An electronic pressure sensitive transducer, shown generally by 20, produces an electrical signal indicative of applied pressure. Pressure transducer 20 includes printed circuit board 22 accepting a plurality of electronic elements, not shown for clarity, for processing the transducer electrical signal. Conductive traces 24 are formed on printed circuit board 22 to define contact area 26. Flexible substrate 28 has inner surface 30 which faces contact area 26 when pressure transducer 20 is assembled. At least one resistive layer 32 is deposited on inner surface 30. Adhesive spacer 34 substantially surrounds contact area 26. Adhesive spacer 34 attaches flexible substrate 28 to printed circuit board 22. When assembled, resistive layer 32 contacts at least two traces 24 in response to pressure applied to flexible substrate 28 to produce electrical signals indicative of applied pressure.

Flexible substrate 28 with resistive layer 32 together with traces 24 on printed circuit board 22 implement a force sensing resistor (FSR), shown generally by 36. Integrating FSR 36 directly onto printed circuit board 22 creates a pressure sensor transducer which may be referred to as "sensor on board" (SOB). Such a construction eliminates some of the materials and manufacturing steps previously required to manufacture a pressure sensitive transducer.

Virtually any printed circuit board 22 can be adapted to receive FSR 36 according to the present invention, providing that sufficient surface space is available for FSR 36. This includes both rigid and flexible circuit boards. Conductive traces 24 on printed circuit board 22 may be formed by any suitable means known in the art. For example, traces 24 may be formed by depositing conductive material on printed circuit board 22 then selectively removing a portion of the conductive material to define traces 24. Dimensions for conductive traces 24 depend on the dimensions of FSR 36, material and construction for flexible substrate 28, material and construction for resistive layers 32, and the like. Typical line thicknesses for conductive traces 24 range between 0.010 inches (0.25 mm) and 0.060 inches (1.5 mm). Typical line spacing between conductive traces 24 ranges between 0.010 inches (0.25 mm) and 0.060 inches (1.5 mm). Positional tolerance of FSR 36 on printed circuit board 22 varies as well, with ±0.015 inches (±0.4 mm) typical.

Two sets of interconnected traces 24 may be used to form a single zone within contact area 26. Multiple zones within contact area 26 permit location of pressure on flexible substrate 28 to be determined. Multiple zones may be obtained by using a plurality of sets of interconnected traces 24 and one interconnected set of common traces 24 extending into each zone. Alternatively, each zone may be defined by two or more separate sets of traces 24. Preferably, the sets of traces 24 in each zone are interdigitated.

Flexible substrate 28 may be constructed from any suitably flexible material such as, for example, Mylar. The thickness of substrate 28 varies depending on the application and dimensions of FSR 36. Preparing substrate 28 for resistive layers 32 entails cutting material for substrate 28 into sheets or other shapes suitable for printing or other methods of depositing resistive layers 32.

One or more resistive layers 32 are deposited on substrate 28 by conventional means such as, for example, by screen printing resistive ink onto substrate 28. Resistive layers 32 may be printed over the entire substrate 28 or only over that portion which will cover operative traces 24 on printed circuit board 22. Resistive layers 32 may also be deposited such that several distinct regions are formed over that portion of substrate 28 which will cover operative traces 24 on printed circuit board 22.

Adhesive 34 is used to attach flexible substrate 28 to printed circuit board 22. Adhesive 34 also provides spacing between resistive layers 32 on substrate 28 and traces 24 on printed circuit board 22. Adhesive 34 may be applied to printed circuit board 22, to flexible substrate 28, or to both as suits manufacturability of FSR 36. Adhesive 34 may be applied to either surface in a conventional manner such as, for example, by depositing a bead of adhesive 34 around some or all of the perimeter of contact area 26. In a preferred embodiment, adhesive layer 34 comprises an adhesive ink screen printed onto substrate 28. Adhesive inks that may be used include product numbers SP-7533 from 3M or ML25184 from Acheson Industries, Inc. of Port Huron, Mich.

If adhesive 34 is applied to substrate 28 in advance of final assembly, a protective release liner may be cut or positioned over adhesive 34 to prevent inadvertent adhesion to other surfaces or airborne materials.

Substrate 28 may be formed into strips and kiss cut, or partially cut, into the desired final shape. Individual substrates 28 may then be easily separated by hand or machine immediately prior to assembly onto printed circuit board 22. Preferably, this final assembly step occurs after electronic components have been mounted on printed circuit board 22 to prevent heat damage to substrate 28 from soldering operations.

If additional space is required between printed circuit board 22 and substrate 28, a pedestal, shown generally by 38, may be formed on printed circuit board 22 in regions where substrate 28 is adhered to printed circuit board 22. Pedestal 38 increases the distance that substrate 28 must be depressed prior to contact between resistive layer 22 and traces 24 on printed circuit board 22. Pedestal 38 may be formed in a variety of manners. First, printed circuit board 22 may be manufactured with additional thickness to form pedestal 38. Second, one or more layers of conductive traces 40 may be built on printed circuit board 22 to form pedestal 38 delineating the contact area. Pedestal 38 is then covered with a non-conducting material 42, such as soldermask, to prevent inadvertent short circuits between traces 40 and resistive layer 32. Third, a polymer thick film may be deposited on printed circuit board 22 to form pedestal 38. Fourth, a sheet of material may be adhered to printed circuit board 22 to form pedestal 38. As will be recognized by one of ordinary skill in the art, many constructions for pedestal 38 are possible.

Figure 2:
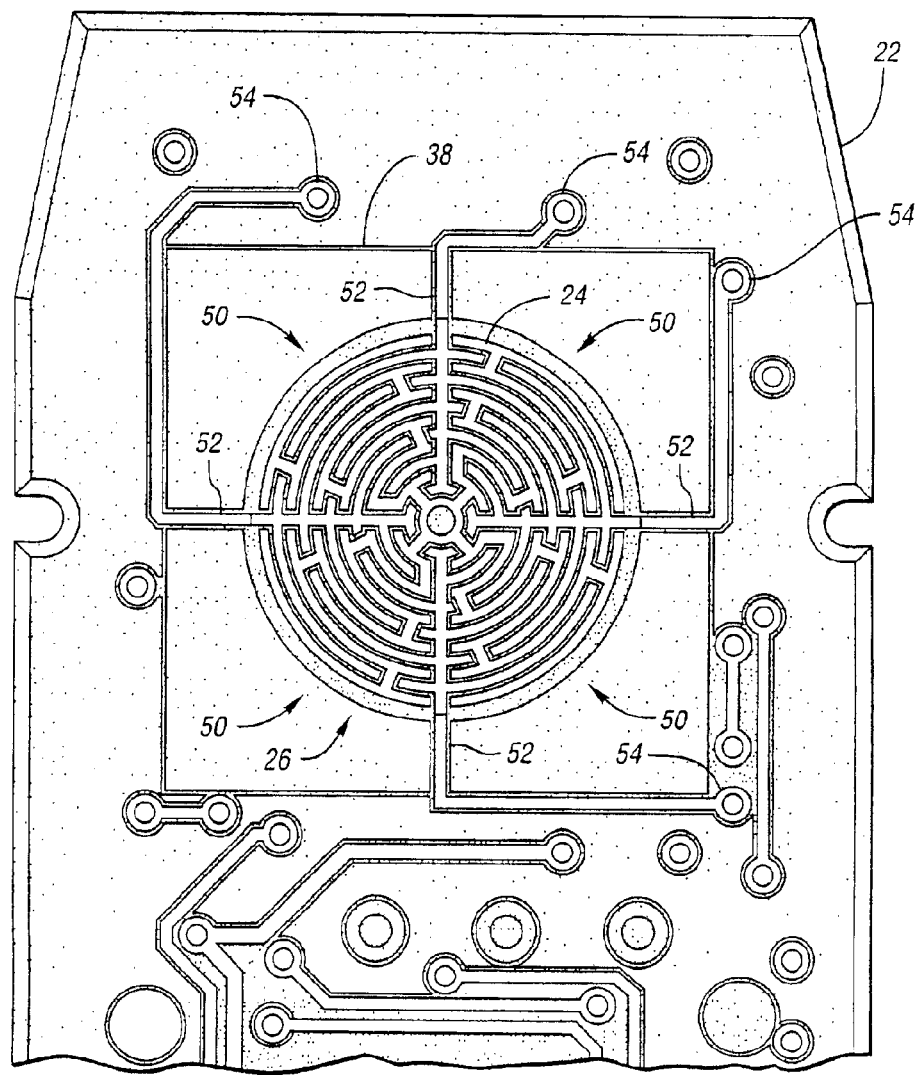
FIG. 2 is a top view of a printed circuit board illustrating a four-zone contact area according to an embodiment of the present invention.

Referring now to FIG. 2, a top view of a printed circuit board illustrating a four-zone contact area according to an embodiment of the present invention is shown. Printed circuit board 22 includes traces 24 within contact area 26 forming four zones, each shown generally by 50. Each zone 50 includes one set of traces 24 interconnected by line 52 which extends out of contact area 26 to through-hole 54. Through-hole 54 permits traces 24 to be connected to electronics mounted on the bottom side of circuit board 22 by soldering processes known in the art. Traces 52 may also connect traces 24 to electronic elements on the same side of printed circuit board 22 as traces 24. Each zone 50 may also share a common set of interconnected traces joined to electronics on the back side of circuit board 22 via throughhole 56 in the center of contact area 26.

Traces 24 may be formed by any means which presents a conductive surface to resistive layer 32. Since air typically fills the gap between printed circuit board 22 and flexible substrate 28, traces 30 should resist corrosion. Traces 24 may be constructed, for example, by plating or coating copper traces with an oxidation preventing conductive material such as gold, silver, solder, carbon ink, and the like. Alternatively, traces 24 may be constructed by screen printing carbon, silver, or other conductive inks onto printed circuit board 22.

Traces 24 and at least a portion of pedestal 38 may be fabricated at the same time and of the same materials. This may result in traces 24 and the base of pedestal 38 extending the same height above board 22. The height of pedestal 38 may be increased by the addition of solder mask or similar material and adhesive spacer 34. This typically will result in a distance between traces 24 and flexible substrate 28 sufficient to prevent inadvertent contact between resistive layer 32 and conductive traces 24. Simultaneous cofabrication of pedestal 38 and traces 24 together with the remainder of circuit board 22 results in very low incremental cost to circuit board 22.

Figure 3:
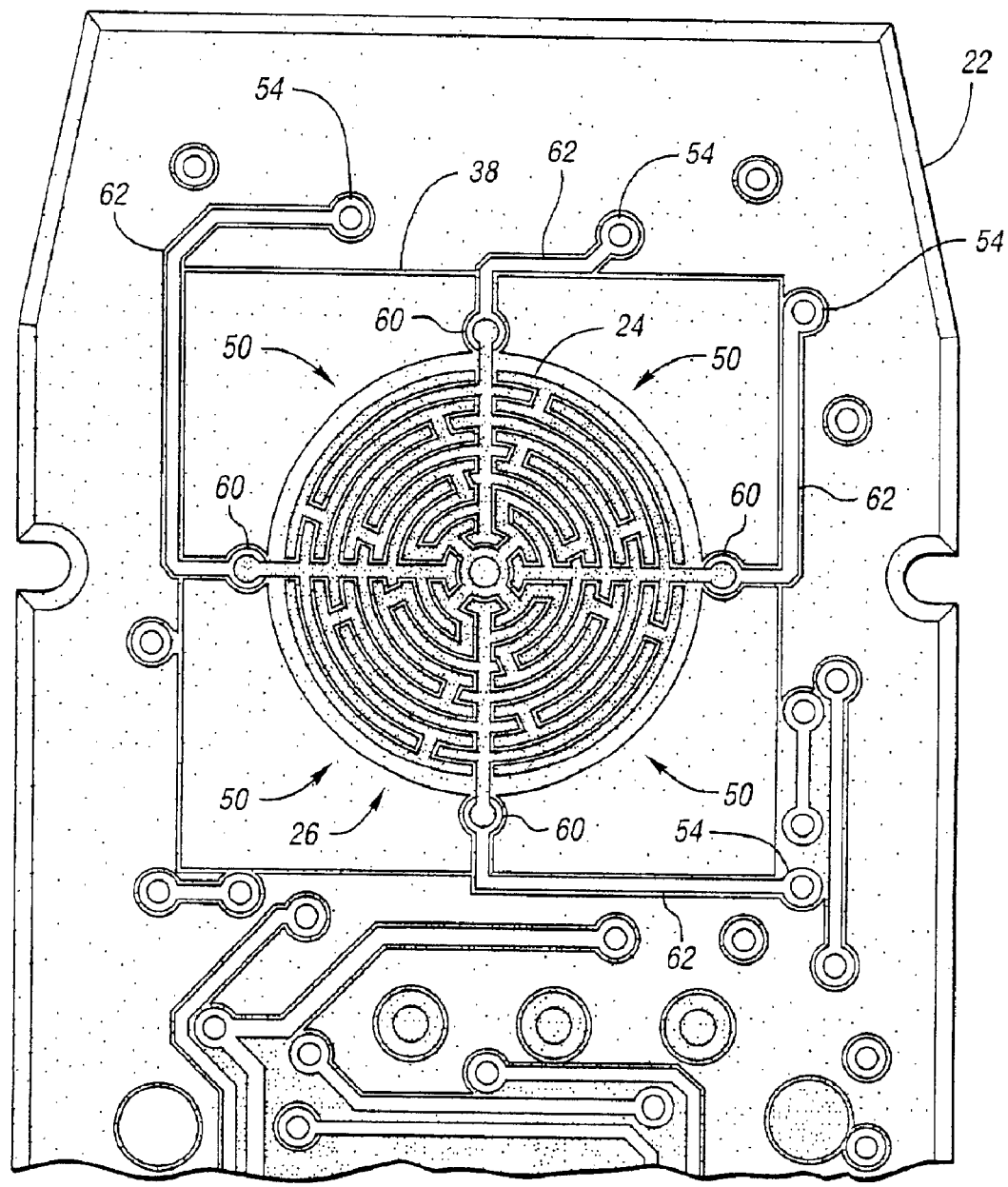
FIG. 3 is a top view of a printed circuit board illustrating carbon traces according to an embodiment of the present invention.

Referring now to FIG. 3, a top view of a printed circuit board with carbon ink traces according to an embodiment of the present invention is shown. Printed circuit board 22 includes screen printed carbon ink traces 24 within contact area 26 forming four zones 50. Due to the high resistivity of screen printed carbon ink, traces 24 are printed over copper pads 60 located just outside of contact area 26. Copper traces 62 connect pads 60 to through holes 54 or to electrical components on the same side of printed circuit board 22 as traces 24.

Figure 4:
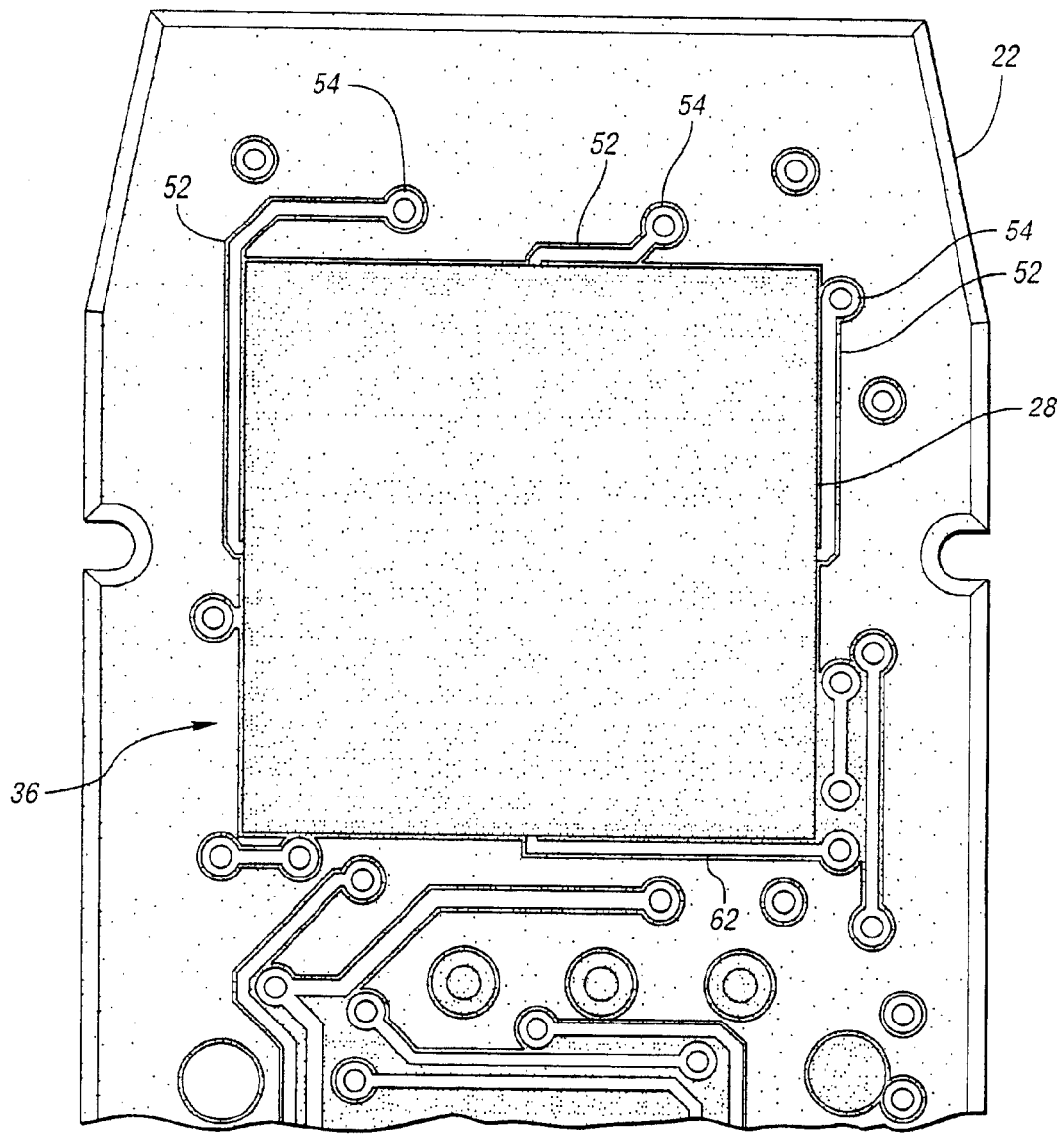
FIG. 4 is a top view of a pressure sensitive transducer constructed using the printed circuit board of FIG. 2 or 3 according to an embodiment of the present invention.

Referring now to FIG. 4, a top view of a pressure sensitive transducer constructed using the printed circuit board of FIG. 2 or 3 according to an embodiment of the present invention is shown. Flexible substrate 28 is shown adhered to pedestal 38 on printed circuit board 22. This results in FSR 36 directly constructed on printed circuit board 22.

Figure 5:
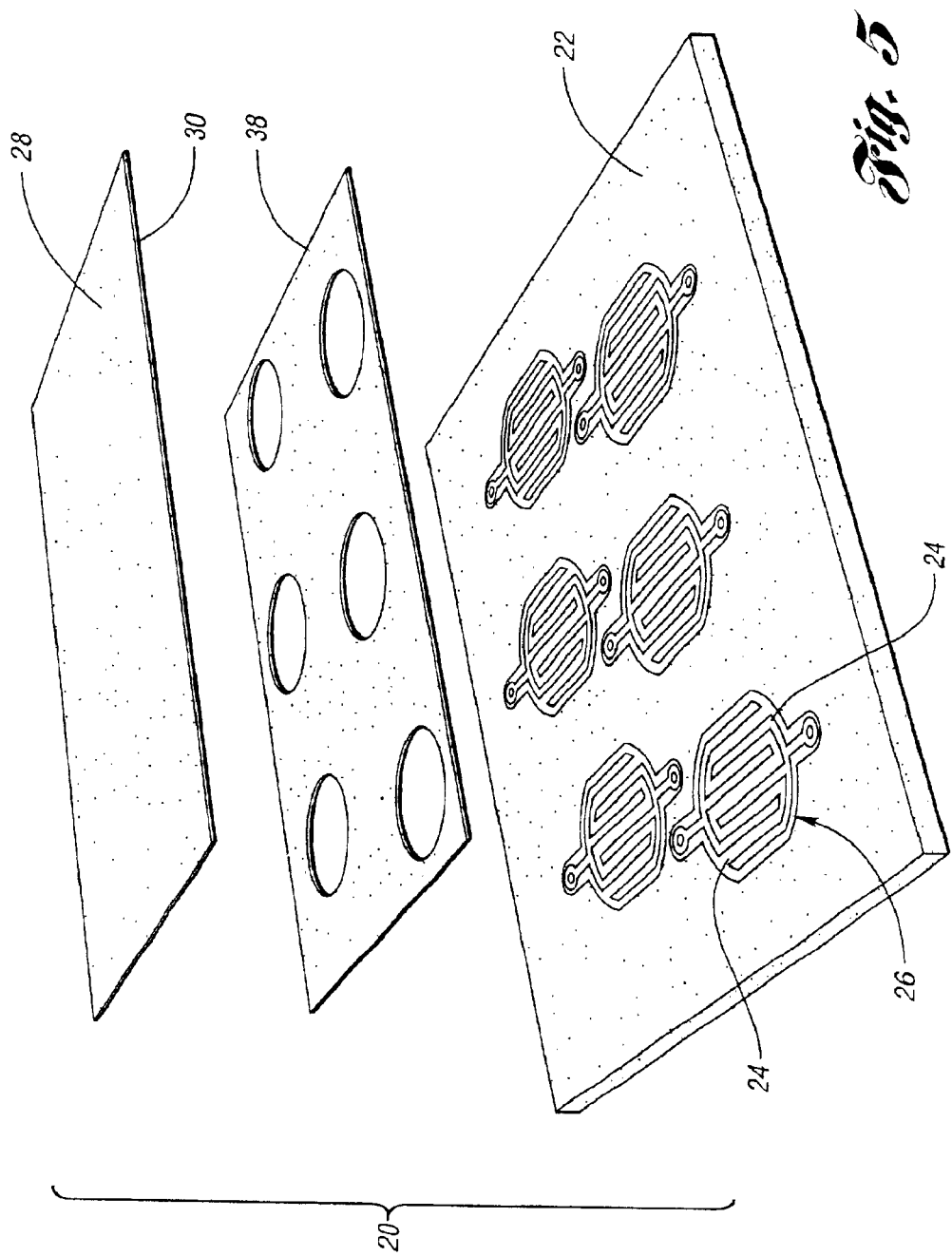
FIG. 5 is an exploded view illustrating conceptualized multiple single-zone FSRs in a pressure sensitive transducer according to an embodiment of the present invention.

Referring now to FIG. 5, an exploded view illustrating multiple single-zone FSRs in a pressure sensitive transducer according to an embodiment of the present invention is shown. Six FSRs are shown. Each contact area 26 includes two sets of interdigitated contacts 24. Spacer 38, in this example a thin plastic sheet coated with adhesive on both sides, is adhered to printed circuit board 22. Spacer 38 includes an opening for each contact area 26. Flexible substrate 28 is then adhered to spacer 38. The entire inner surface 30 of flexible substrate 28 may be coated with one or more resistive layers 32. Alternatively, separate disconnected resistive layers 32 corresponding with each contact area 26 may be formed on flexible substrate 28.

Figure 6:
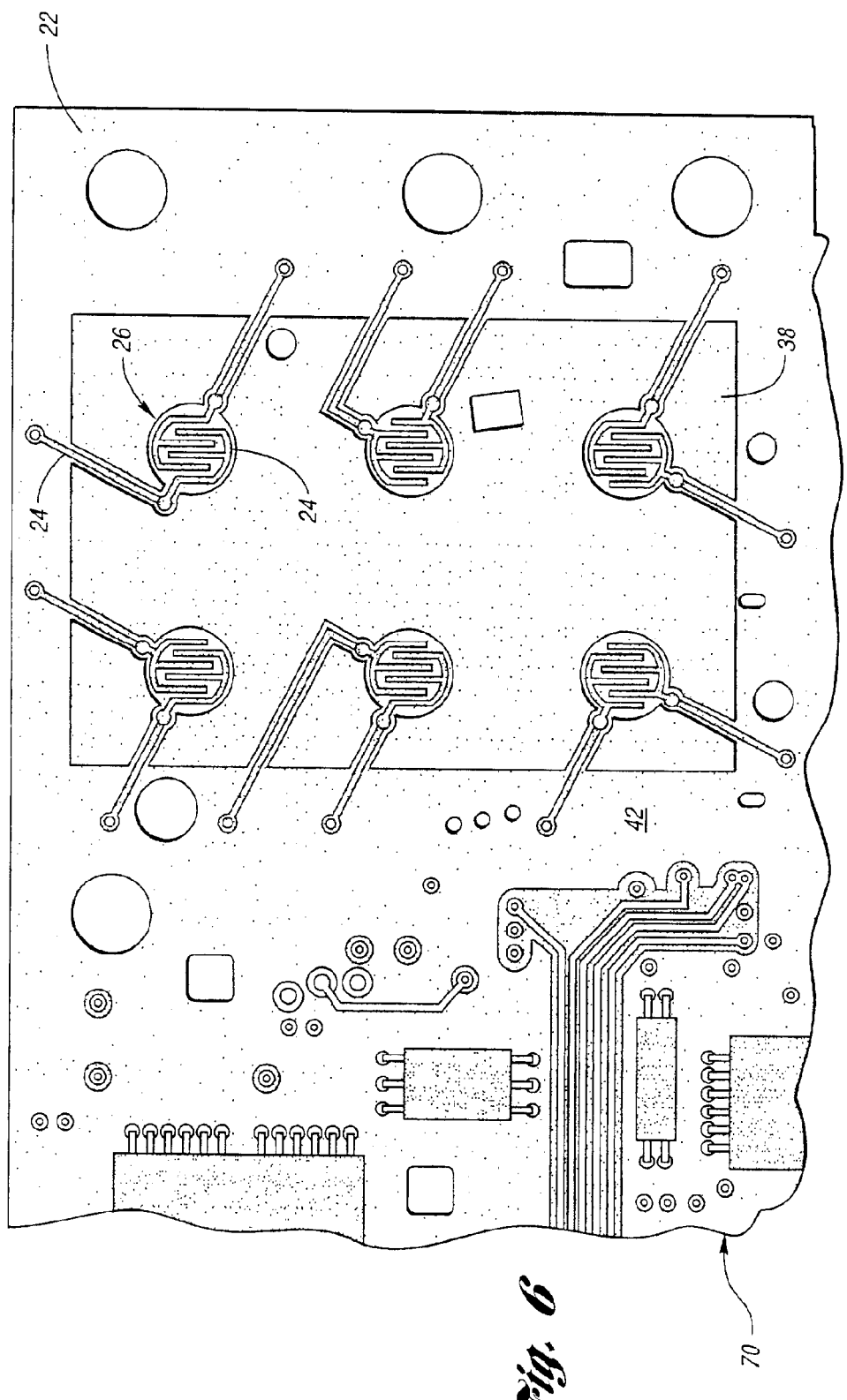
FIG. 6 is a top view of a printed circuit board implementing multiple single-zone FSRs in a pressure sensitive transducer according to an embodiment of the present invention.

Referring now to FIG. 6, a top view of a printed circuit board implementing multiple single-zone FSRs in a pressure sensitive transducer according to an embodiment of the present invention is shown. Printed circuit board 22 includes six contact areas 26 with traces 24 formed by screen printing carbon ink onto printed circuit board 22. Copper pedestal 38 surrounds contact areas 26 delineating them. Pedestal 38 may have a wide variety of shapes, but typically mirrors the outline of flexible substrate 28, not shown for clarity. Soldermask 42 covers much of circuit board 22 while leaving contact areas 26 exposed to contact resistive layer 32 on flexible substrate 28. Printed circuit board 22 also contains electronic components, shown generally by 70, soldered to printed circuit board 22 for receiving electrical signals from traces 24 indicative of pressure applied to the FSRs.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. An electronic pressure sensitive transducer producing an electrical signal indicative of applied pressure, the transducer comprising:

a printed circuit board;

a plurality of conductive traces formed on the printed circuit board to define a contact area;

a flexible substrate having an inner surface positioned over the contact area;

an adhesive spacer and a pedestal substantially surrounding the contact area, the adhesive spacer and the pedestal attaching the flexible substrate to the printed circuit board, the pedestal comprising conductive material delineating the contact area on the printed circuit board; and at least one resistive layer deposited on the flexible substrate inner surface, the resistive layer contacting at least two of the traces in response to pressure applied to the flexible substrate to produce the electrical signal indicative of applied pressure.

2. An electronic pressure sensitive transducer as in claim 1 wherein at least one resistive layer comprises resistive ink.

3. An electronic pressure sensitive transducer as in claim 1 wherein the pedestal conductive traces are covered with a non-conductive material.

4. An electronic pressure sensitive transducer as in claim 1 wherein the plurality of conductive traces comprise:

a plurality of sets of traces, each set of traces interconnected within a zone of the contact area; and an interconnected set of common traces extending into each zone.

5. An electronic pressure sensitive transducer as in claim 4, wherein at least one interconnected set of traces is connected to electronic elements soldered to the printed circuit board for processing the transducer electrical signal via a through-hole in the printed circuit board.

6. An electronic pressure sensitive transducer as in claim 5 wherein the through-hole is within the contact area.

7. An electronic pressure sensitive transducer as in claim 1 wherein conductive traces are arranged in interconnected sets, with at least two sets of traces interdigitated.

8. An electronic pressure sensitive transducer as in claim 1 wherein conductive traces comprise copper traces covered with an oxidation preventing conductive material.

9. An electronic pressure sensitive transducer as in claim 1 wherein conductive traces comprise screen printed carbon ink.

10. A printed circuit board electronic pressure sensitive transducer assembly comprising:

a printed circuit board manufactured to accept a plurality of electronic elements for processing pressure transducer electrical signals;

a plurality of conductive traces formed on the printed circuit board to define a contact area;

a flexible substrate having an inner surface positioned over the contact area;

an adhesive spacer and a pedestal substantially surrounding the contact area, the adhesive spacer and the pedestal attaching the flexible substrate to the printed circuit board, the pedestal formed of conductive material delineating the contact area on the printed circuit board; and at least one resistive layer comprising a resistive ink deposited on the flexible substrate inner surface, the resistive layer contacting at least two of the contact area conductive traces in response to pressure applied to the flexible substrate.

11. A printed circuit board electronic pressure sensitive transducer assembly as in claim 10 wherein the pedestal a conductive material is coated with a non-conductive material.

12. A printed circuit board electronic pressure sensitive transducer assembly as in claim 10 wherein the plurality of conductive traces comprise:

a plurality of sets of traces, each set of traces interconnected within a zone of the contact area; and an interconnected set of common traces extending into each zone.

13. A printed circuit board electronic pressure sensitive transducer assembly as in claim 12 wherein at least one interconnected set of traces is connected to the electronic elements for processing the transducer electrical signal via a through-hole in the printed circuit board.

14. A printed circuit board electronic pressure sensitive transducer assembly as in claim 13 wherein the through-hole is within the contact area.

15. A printed circuit board electronic pressure sensitive transducer assembly as in claim 10 wherein conductive traces are arranged in interconnected sets, with at least two sets of traces interdigitated.

16. An electronic pressure sensitive transducer as in claim 10 wherein the adhesive spacer comprises adhesive ink.

17. A printed circuit board electronic pressure sensitive transducer assembly as in claim 10 wherein conductive traces comprise copper traces covered with an oxidation preventing conductive material.

18. A printed circuit board electronic pressure sensitive transducer assembly as in claim 10 wherein conductive traces comprise screen printed carbon ink.

19. A printed circuit board electronic pressure sensitive transducer assembly comprising:

a printed circuit board including accepting a plurality of electronic elements for processing pressure transducer electrical signals;

a plurality of conductive traces formed on the printed circuit board to define a contact area;

a pedestal substantially surrounding the contact area, the pedestal forming a flat area higher than the conductive traces, the pedestal comprising the same conductive material used to form the conductive traces the material delineating the contact area;

a flexible substrate having an inner surface positioned over the contact area;

an adhesive spacer substantially surrounding the contact area, the adhesive spacer attaching the flexible substrate to the pedestal; and at least one resistive layer deposited on the flexible substrate inner surface, the resistive layer contacting at least two of the contact area conductive traces in response to pressure applied to the flexible substrate.

20. A printed circuit board electronic pressure sensitive transducer assembly as in claim 10 wherein the pedestal is formed by depositing a non-conductive layer over a conductive layer, the conductive layer formed on the printed circuit board.

21. An electronic pressure sensitive transducer as in claim 19 wherein at least one resistive layer comprises resistive ink.

22. An electronic pressure sensitive transducer as in claim 19 wherein the adhesive spacer comprises adhesive ink.

23. A printed circuit board electronic pressure sensitive transducer assembly as in claim 19 wherein the plurality of conductive traces comprise:

a plurality of sets of traces, each set of traces interconnected within a zone of the contact area; and an interconnected set of common traces extending into each zone.

24. A printed circuit board electronic pressure sensitive transducer assembly as in claim 23 wherein at least one interconnected set of traces is connected to the electronic elements for processing the transducer electrical signal via a through-hole in the printed circuit board.

25. A printed circuit board electronic pressure sensitive transducer assembly as in claim 24 wherein the through-hole is within the contact area.

26. A printed circuit board electronic pressure sensitive transducer assembly as in claim 19 wherein conductive traces are arranged in interconnected sets, with at least two sets of traces interdigitated.

27. A printed circuit board electronic pressure sensitive transducer assembly as in claim 19 wherein conductive traces comprise copper traces coated with an oxidation preventing conductive material.

28. A printed circuit board electronic pressure sensitive transducer assembly as wherein conductive traces comprise screen printed carbon ink.

29. An electronic pressure sensitive transducer as in claim 1 further comprising electronic components soldered to the printed circuit board, the electrical components receiving electrical signals from the plurality of conductive traces defining the contact area.

* * * * *

UNITED STATES PATENT AND TRADEMARK OFFICE
CERTIFICATE OF CORRECTION

PATENT NO. : 6,909,354 B2
APPLICATION NO. : 10/067952
DATED : June 21, 2005
INVENTOR(S) : Jeffrey R. Baker et al.

Page 1 of 1

It is certified that error appears in the above-identified patent and that said Letters Patent is hereby corrected as shown below:

Column 9, Line 10, Claim 19:

after "and" take a new line

Column 10, Line 22, Claim 28:

After "as" insert -- in claim 19 --.

Signed and Sealed this

First Day of August, 2006

JON W. DUDAS
*Director of the United States Patent and Trademark Office*